United States Patent [19]

Sakai

[11] Patent Number: 5,576,241
[45] Date of Patent: Nov. 19, 1996

[54] METHOD OF SEPARATING SEMICONDUCTOR WAFER WITH DIELECTRICS

[75] Inventor: Yoshiyuki Sakai, Nagano, Japan

[73] Assignee: Fuji Electric Co., Ltd., Kawasaki, Japan

[21] Appl. No.: 455,173

[22] Filed: May 31, 1995

[30] Foreign Application Priority Data

May 31, 1994 [JP] Japan ................................. 6-117296

[51] Int. Cl.$^6$ ............................................. H04L 21/76
[52] U.S. Cl. ..................... 437/63; 437/62; 437/64; 437/67; 148/DIG. 50
[58] Field of Search ........................... 437/67, 62, 63, 437/64; 148/DIG. 50

[56] References Cited

U.S. PATENT DOCUMENTS

| 4,528,047 | 7/1985 | Beyer et al. | 437/67 |
| 4,916,086 | 4/1990 | Takahashi et al. | 437/67 |
| 5,124,274 | 6/1992 | Ohki et al. | 437/67 |
| 5,336,634 | 8/1994 | Katayama et al. | 437/974 |

FOREIGN PATENT DOCUMENTS

| 58-199536 | 11/1983 | Japan . | |
| 0163897 | 9/1984 | Japan | 437/67 |
| 61-05544 | 1/1986 | Japan . | |
| 0216261 | 9/1987 | Japan | 437/67 |
| 0215050 | 9/1988 | Japan | 437/67 |
| 1239870 | 9/1989 | Japan . | |
| 0190658 | 7/1993 | Japan | 437/67 |

*Primary Examiner*—Thung Dang
*Attorney, Agent, or Firm*—Morrison Law Firm

[57] ABSTRACT

A method for separating a joined substrate type wafer, which wafer is composed of a pair of semiconductor substrates joined through an insulation film, utilizes dielectrics through simple processing steps. Trenches for separating a semiconductor substrate with dielectrics are dug from the surface of the substrate and a dielectrics film is deposited on the surface of the substrate including the trenches. Then poly-crystalline silicon under layer is grown by CVD method to a thickness of about 0.5 μm. Thereafter, a poly-crystalline silicon filler layer, which is deep enough to fill the trenches, is grown over the underlying poly-crystalline silicon under layer, followed by selectively removing the two poly-crystalline silicon layers from the surface of the substrate excluding the regions inside the trenches. An alternative embodiment contemplates depositing a second dielectrics film interposed between the poly-crystalline silicon under layer and the poly-crystalline silicon filler layer. The overall process substantially increases the insulation between the various semiconductor regions while increasing the smoothness of the dielectrics film by controlling the grain size of the poly-crystalline silicon matrix.

10 Claims, 6 Drawing Sheets

METHOD OF SEPARATING SEMICONDUCTOR WAFER WITH DIELECTRICS

BACKGROUND OF THE INVENTION

The present invention relates to methods for separating a wafer for integrated circuit apparatuses with dielectrics. More particularly, the present invention relates to a methods of separating, with dielectrics a junction separation type wafer for integrated circuit apparatuses.

Among conventional integrated circuit apparatuses, junction separation type wafers are usually used for separating the work potential of the circuit elements or the circuit parts from each other utilizing a reversely biassed pn junction for preventing the circuit elements or the circuit parts from interfering each other.

However, since the parasitic effects of known built-in transistors or diodes often cause trouble such as latching-up etc., and mindful that operation interferences often interfere with each other, dielectrics separation type wafers, especially the above described joined substrate type wafers, have been utilized within the context of integrated circuit apparatuses for high frequency use. Such devices are particularly suited to applications contingent upon high reliability over time.

Utilizing dielectrics separation type wafers to separate the semiconductors into a plurality of mutually separated semiconductor regions shows that this is quite effective when done with dielectrics. Particular interest has been shown this approach among known devices, however, prominent difficulties remain.

The prominence of the extant difficulties, pertaining to prior art methods for separating conventional wafers with dielectrics, among the devices of the prior art is demonstrated by reference to FIGS. 3(a) to 3(f).

FIGS. 3(a) to 3(f) show a conventional dielectrics separation type wafer according to the prior art. However, significant issues remain unaddressed among the devices of the prior art.

FIG. 3(a) is a sectional view showing a joined substrate dielectrics type wafer shown generally at 10 to be separated with dielectrics. The joined substrate type wafer 10 includes a semiconductor substrate 11, and an (n) type semiconductor substrate 13 jointed at high temperature onto substrate 11 through an insulation film 12, which contains silicon oxide and similar insulating material. Substrate 13 is lapped to a predetermined thickness and mirror polished.

The dielectrics separation of the wafer 10 is conducted as follows. Referring to FIG. 3(b), trenches 20 are dug by anisotropic etching, using an etching mask of oxide film, from the surface of semiconductor substrate 13 down to the insulation film 12 to divide substrate 13 into a plurality of semiconductor regions 14.

Referring to FIG. 3(c), the entire surface of wafer 10 including trenches 20 is covered with dielectrics film 21 by thermal oxidation or similar methods which are known to those having a modicum of skill in the art.

Subsequently, a poly-crystalline silicon 30 is grown on dielectrics film 21 by the CVD method to a predetermined thickness so as to completely fill the trenches 20 with the poly-crystalline silicon 30. Refer to FIG. 3(d).

The deposition of the dielectrics film 21 and the growth of the poly-crystalline silicon 30 are conducted over the entire surface of the wafer 10. Thereafter, excess poly-crystalline silicon 30 is removed from the surface of wafer 10 by the etching back method. Refer to FIG. 3(e).

The dielectrics separation type wafer 50 of FIG. 3(f) is completed by removing the dielectric film 21 from the surface of the semiconductor regions 14 leaving an extension 22 of the dielectric film 21 in the immediate vicinity of trench 20, along the perimeter (periphery) of trenches 20. This step is undertaken to treat the entire surface of wafer 10, except the inside of each trench 20. This step involves an dry etching technique known as etching back, and includes removing the dielectrics film 21 from the upper surface of the semiconductor regions 14. Refer to FIG. 3(f). Circuit elements or circuit parts of the integrated circuit are distributed and built in semiconductor regions 14 which are insulated from each other on the wafer 50.

Longstanding problems remain to be solved by the subject matter of the present invention. Although the dielectrics separation type wafer according to the prior art shows a moderate separation performance in terms of reducing the parasitic effects (or interference), a major drawback is that among conventional integrated devices, the circuit elements or parts should be completely isolated and immune from the parasitic effects (interferences) from neighboring parts.

Prior art attempts to reduce the parasitic effects have included insulating the semiconductors regions 14 from each other. However, unstable operations or oscillations of conventional separation type wafers have, on occasion, interfered with the operations of conventional separation type wafers. Indeed, prior art attempts have generally been unsuccessful in shielding individual regions from interferences from other semiconductor regions.

The present inventor has discovered that the instability of prior art integrated devices results from the parasitic effects discussed above. Indeed, the present invention is premised upon the discovery that prior art devices have suffered substantial interference from neighboring semiconductor regions due, in large part, upon the ineffective insulation between the semiconductor regions 14.

The present inventor has also discovered additional defects which contribute to the general failure of prior an wafers. Such defects include a defective patterning process along the peripheral surface of the semiconductor region 14 in the extension 22 of the dielectrics film 21, which generally extending out of the trench 20, along its periphery.

Referring now to FIG. 4, a sectional view showing an upper part of the trench 20 is shown. When the upper surface of extension 22 is rough, then in patterning extension 22 by dilute hydrofluoric acid using a photoresist film as a masking M, the echant (i.e., dilute hydrofluoric acid) E can penetrate the masking M and erode extension 22.

In the worst case scenario, echant E can penetrate semiconductor region 14 and seep into the poly-crystalline silicon 30 in trench 20 and erode the upper part of the dielectrics film 21.

In an attempt to overcome his drawback, prior art has contemplated patterning extension 22 by an etching process exemplified by plasma etching. This process improves somewhat the insulation between the semiconductor regions 14 but is not completely effective.

However, the present inventor has discovered that the rough appearance of the, upper surface of extension 22 is caused primarily by the matrix of the poly-crystalline silicon 30, which contains crystal grains of varying sizes. The grain size distribution pattern in the poly-crystalline silicon matrix is transferred (copied) to the dielectrics film 21, which, in turn, has been implicated in causing the rough upper surface generally associated with conventional extension 22.

In order to address these longstanding problems, the present invention provides a method of separating a semiconductor wafer with dielectrics. The present invention solves the problems described above which are inherent in known disclosures.

Further, prominent among the drawbacks of known dielectrics separation type wafers are the overall production costs. The present invention likewise reduces the overall cost of the dielectric separation processes, thus enhancing the economic utility of applicants' teachings.

OBJECTS AND SUMMARY OF THE INVENTION

It is an object of the present invention to provide a method of separating semiconductor wafers with dielectrics which overcomes the drawbacks of the prior art.

It is another object of the present invention to overcome the various drawback pertaining specifically the defective insulation between the semiconductor regions of conventional dielectrics separation type waters.

Briefly, the present invention provides a method for separating a joined substrate type wafer, in which the wafer is composed of a pair of semiconductor substrates joined through an insulation film. The method utilizes dielectrics through simple processing steps. Initially, trenches for separating the semiconductor substrate with dielectrics are dug from the surface of the substrate and a dielectrics film is deposited on the surface of the substrate including the trenches.

Then poly-crystalline silicon under layer is grown by the CVD method to a thickness of about 0.5 μm. Thereafter, a poly-crystalline silicon filler layer, which is deep enough to fill the trenches, is grown over the underlying poly-crystalline silicon under layer, followed by selectively removing the two poly-crystalline layers from the surface of the substrate excluding the regions inside, the trenches.

An alternative embodiment contemplates depositing a second dielectrics film interposed between the poly-crystalline silicon under layer and the poly-crystalline silicon filler layer. The overall process substantially increases the insulation between the various semiconductor regions while increasing the smoothness of the dielectrics film by controlling the grain size of the poly-crystalline silicon which is in contrast with the first dielectrics film.

According to an embodiment of the invention, there is provided a method for separating a wafer for integrated circuit apparatuses with dielectrics into a plurality of semiconductor regions insulated from each other. The method includes the steps of digging at least one trench for separating the first semiconductor substrate with dielectrics from a surface of the first semiconductor substrate down to the insulation film; covering a surface of the wafer including the trenches with a dielectrics film; growing a poly-crystalline silicon under layer on an entire surface of the wafer, wherein the under layer is in a contacting relationship with the dielectrics film; growing a poly-crystalline silicon filler layer and filling the trenches with the polycrystalline silicon filler layer; and removing each of the under layer and the filler layer from the surface of the wafer, excluding the trenches to enhance growth of the remainder of the poly-crystalline silicon under layer and the filler layer still remaining inside the trenches.

An alternative embodiment of the invention, embraces a method for separating a wafer for integrated circuit apparatuses with dielectrics into a plurality of semiconductor regions insulated from each other, which includes the steps of digging at least one trench for separating the first semiconductor substrate with dielectrics from a surface of the first semiconductor substrate down to the insulation film; covering a surface of the wafer including the trenches with a first dielectrics film; growing a poly-crystalline silicon under layer on an entire surface of the wafer, wherein the under layer is in a contacting relationship with the first dielectrics film; covering the entire surface of the under layer with a second dielectrics film; growing a poly-crystalline silicon filler layer and filling the trenches with the poly-crystalline silicon filler layer; and removing each of the under layer and the filler layer from the surface of the wafer, excluding the trenches to enhance growth of the remainder of the polycrystalline silicon under layer and the filler layer still remaining inside the trenches.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1A:
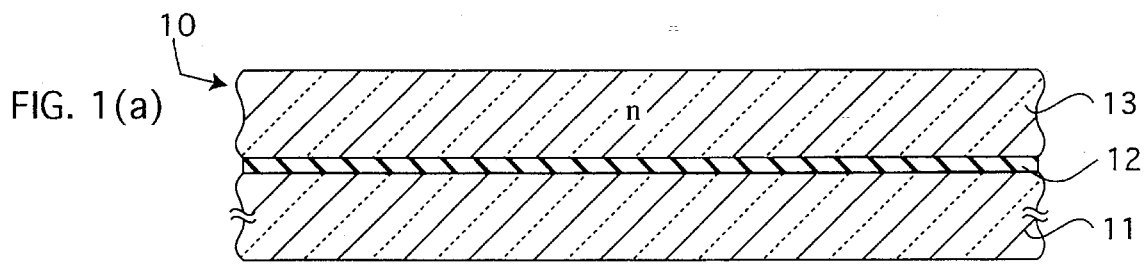
FIG. 1(a) is a sectional view showing a joined substrate type wafer before being separated with dielectrics.

The object of the present invention is achieved by a method which contemplates separating a wafer with dielectrics into a plurality of semiconductor regions insulated from each other.

A first method includes the steps of: (a) providing at least one trench, more preferably a plurality of trenches, for separating the semiconductor wafer with dielectrics from the surface of the wafer; (b) covering the surface of the wafer including the trenches with a dielectrics film; (c) growing, by the CVD method, a thin poly-crystalline silicon under layer and covering the entire surface of the wafer, which was previously covered with the dielectrics film, with the poly-crystalline silicon under layer such that the poly-crystalline silicon under layer is in a contacting relationship with the dielectrics films; (d) growing by the CVD method poly-crystalline silicon filler layer and filling the trenches with the poly-crystalline silicon filler layer; followed by (e) removing the poly-crystalline silicon under layer and poly-crystalline silicon filler layer from the surface of the wafer excluding the inside of the trenches. The step of providing the trenches can include any conventional means include digging trenches by a reactive ion etching method.

The first method has advantages not realized by the prior art. A prominent advantage is a dielectric film having a smooth upper surface. Apparently, by growing the thin poly-crystalline silicon under layer onto the dielectric film prior to growing the poly-crystalline silicon filler layer, enables the poly-crystalline silicon matrix, which covers the dielectrics film, to be of a small grain size. It is thought that the small grain size, in turn, provides for the dielectric film to have a smooth upper surface. This smooth surface, in turn, prevents etching substances such as dilute hydrofluoric acid and similar substances, which are suitable for etching the dielectric film, from penetrating and damaging the dielectrics film.

An alternative embodiment (hereinafter referred to as the "second method") contemplates a method for separating a wafer with dielectrics into a plurality of semiconductor regions insulated from each other, which includes the steps of: (a) providing at least one trench, and preferably a plurality of trenches for separating the semiconductor wafer with dielectrics from the surface of the wafer; (b) covering the surface of the wafer including the trenches with a first dielectrics film; (c) growing by the CVD method thin poly-crystalline silicon under layer on the entire surface of the wafer which, as indicated, was previously covered by the first dielectrics film such that the poly-crystalline silicon under layer is in a contacting relationship with the dielectrics film; (d) covering the under layer with a second thin dielectrics film; (e) growing by the CVD method a poly-crystalline silicon filler layer and filling the trenches with the filler layer; and (f) removing the poly-crystalline silicon filler layer together with the first and second dielectrics films from the surface of the wafer excluding the region inside the trenches. The step of proving the trenches can include any conventional means include digging trenches by reactive ion etching method.

The present invention is applicable to the SOI type wafer or the joined substrate type wafer, which includes a pair of semiconductor substrates joined through a dielectrics film. One member of the pair of the semiconductor substrates is provided with the trenches dug from its surface down to the dielectrics film. It is preferable to cover the trench opening with a dielectrics film.

Likewise, it is preferable to grow the poly-crystalline silicon under layer to a thickness of about 0.5 µm or less. It is preferred that the thickness of the underlying poly-crystalline silicon film be less than 0.5 µm. The poly-crystalline silicon film is generally formed by the CVD method which aids in minimizing the distribution and grain size of the poly-crystalline silicon film. The grain size can be minimized by adjusting the CVD pressure and temperature together with maintaining (setting) the growth rate of the under layer to be slower than that of the filler layer.

In the second method it is preferable to grow the second dielectrics film of silicon oxide to a thickness of from 0.1 to 0.2 µm, prior to growing the poly-crystalline silicon filler layer.

When practicing the second method, it is most preferable to thermally oxidize the portion of the poly-crystalline under layer and the poly-crystalline filler layer which is left remaining above the trench. This usually occurs after the second dielectrics film together with the poly-crystalline under layer are selectively removed. The step of thermal oxidation provides thick oxidizing separation films above the trenches. It is preferable to dope impurities on the surface of the poly-crystalline silicon under and poly-crystalline silicon filler layers above the trenches, followed by thermally oxidizing the doped under and filler layers.

Note that thermal oxidation proceeds fastest in the doped regions than on the surface of the semiconductor regions.

The second method of the present invention, which contemplates a thin dielectrics film (the second dielectrics film) between the poly-crystalline silicon under layer and the poly-crystalline silicon filler layer, the second thin dielectric film, also prevents further peeling (by etching) of the poly-crystalline filler layer at the second thin dielectrics film when the excess poly-crystalline silicon filler layer is removed from the surface of the wafer excluding the inside of the trenches. This also prevents the first dielectrics film from being damaged even when the echant (i.e. dilute hydrofluoric acid) penetrates and seeps into the region between the pattering mask and the poly-crystalline silicon under layer, since the under layer always exists on the first dielectrics film to be patterned.

Although the poly-crystalline silicon under layer on the extension of the first dielectrics film may be removed after the patterning, it is more preferable to oxidize the poly-crystalline silicon under layer left behind on the surface of the trench region to form the insulating separation film which effectively insulates the various semiconductor regions.

The present invention is explained hereinafter with reference to the accompanying drawings which illustrate the various embodiments contemplated by the present invention.

Referring now to FIG. 1(a), a wafer shown generally at 10 before dielectric separation. Wafer 10 is obtained by joining an (n) type semiconductor substrate 13 with an appropriate semiconductor substrate 11 by means of an insulation film 12, interposed therebetween. Insulation film 12 is preferably a silicon dioxide film. Substrate 13 exhibits a resistivity of at least from 1–20 Ω cm and ranges in thickness form about 10 to 50 µm. Insulation film 12, in turn, ranges in thickness from at least 0.5 to 1 µm.

Figure 1B:
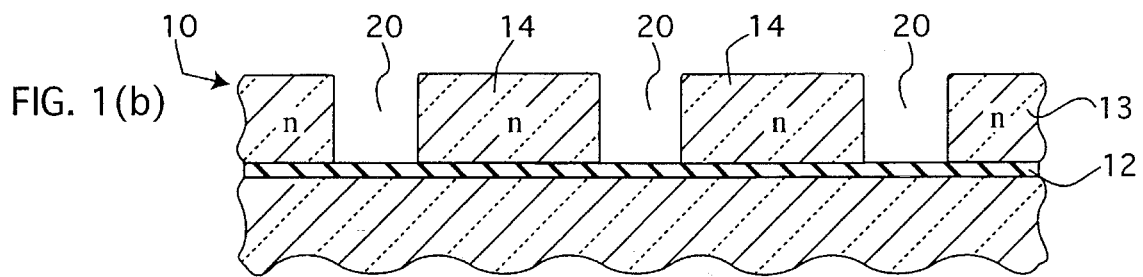
FIG. 1(b) is a sectional view showing the step of digging the trenches according to an embodiment of the first method contemplated by the present invention.

Referring now to FIG. 1(b), the wafer 10 is shown after trenches shown generally at 20 have been dug. In digging trenches 20, substrate 13 is divided into a plurality of semiconductor regions 14 by digging trenches 20 deep down to the insulation film 12 by an anisotropic reactive ion etching method using a gas containing fluorine. The resulting trenches 20 vary in width from 5 to 10 µm.

Figure 1C:
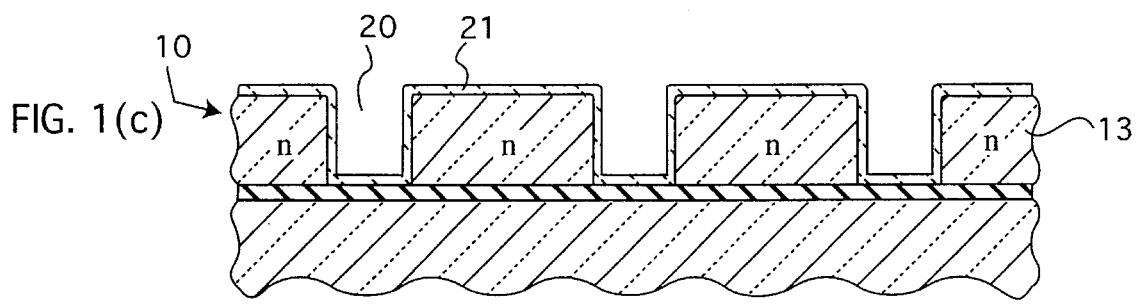
FIG. 1(c) is a sectional view showing the step of depositing the dielectrics film on the faces (openings) of the trenches and the semiconductor region according to an embodiment of the first method of the present invention.

Referring now to FIG. 1(c) the entire surface of wafer 10 is covered with a dielectric film 21, to a thickness of about 1 µm. The layer is formed by thermal oxidation.

Figure 1D:
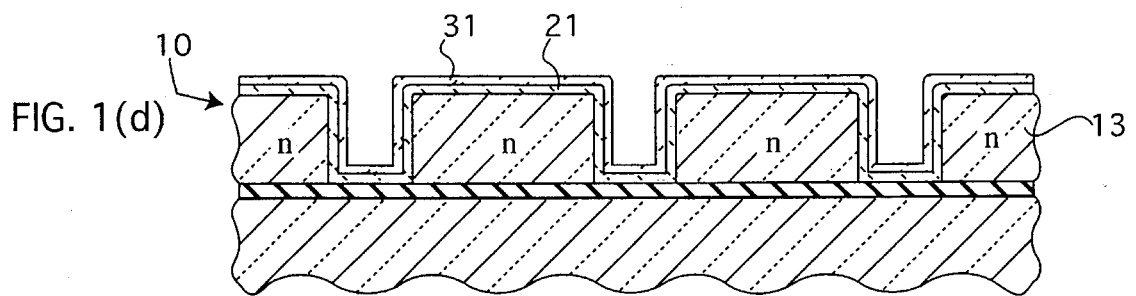
FIG. 1(d) is a sectional view showing the step of growing the poly-crystalline silicon under layer according to the first method of the present invention.

Referring now to FIG. 1(d), the wafer 10 is shown in a state in which the entire surface of substrate 13 including trenches 20 and semiconductor region 14, are covered by a thin poly-crystalline silicon under layer 31 which is in a contacting relationship with the dielectrics film. The poly-crystalline silicon under layer 31 is grown by the CVD method using a silane or dichloro silane reaction gas under reduced pressure. The poly-crystalline silicon under layer 31 is grown to a thickness of about 0.5 µm or less.

The thin poly-crystalline silicon under layer 31 can be grown to exhibit a fine texture by suppressing its thickness such that it is thinner than the poly-crystalline silicon filler layer 33 (described later).

However, it is preferable to adjust the pressure and temperature during the CVD method in order to control the growth rate of the poly-crystalline silicon under layer 31. Likewise, it is desirable to control the growth rate of the poly-crystalline silicon under layer 31 to be slower than that of the poly-crystalline silicon filler layer 33, so that the grain size of the poly-crystalline silicon under layer 31 is less varied and somewhat smaller than that of the poly-crystalline silicon filler layer 33.

Figure 1E:
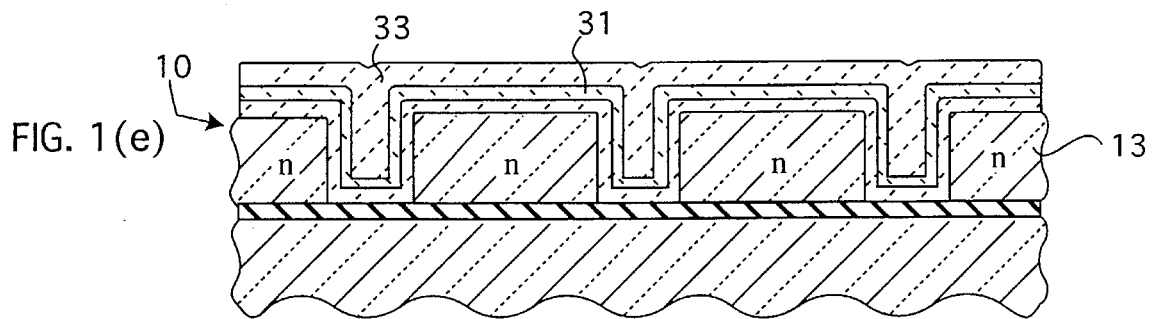
FIG. 1(e) is a sectional view showing the step of growing the poly-crystalline silicon filler layer according to the first method of the present invention.

Referring now to FIG. 1(e), a preparatory step for the growth of the poly-crystalline silicon filler layer 33 grown on the poly-crystalline silicon under layer 31 is shown. In this step, the poly-crystalline silicon filler layer 33 is grown on the poly-crystalline silicon under layer 31 to a thickness sufficient to completely fill trenches 20. A preferred thickness of the poly-crystalline silicon filler layer 33 is from 1 to 7 µm. and more preferably from 3 to 5 µm. The poly-crystalline silicon filler layer 33 may be grown by the CVD method. The rate of growth of the poly-crystalline silicon filler layer 33 by the CVD method may be set at higher value and the CVD conditions need not consider the small grained poly-crystalline matrix.

Figure 1F:
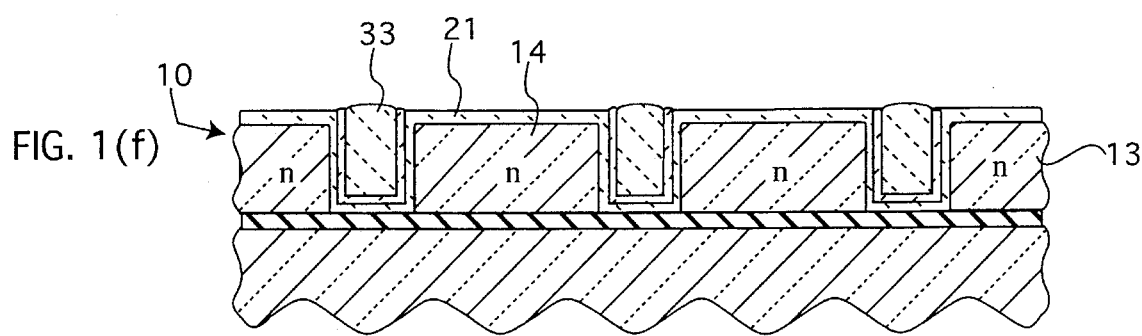
FIG. 1(f) is a sectional view showing the step of removing excessive the poly-crystalline silicon under layer and polycrystalline silicon filler layers according to the first method of the present invention.

Referring now to FIG. 1(f), the steps necessary to remove the excessive poly-crystalline silicon filler layer 33 and the poly-crystalline silicon under layer 31 is shown. The poly-crystalline silicon under layer 31 and the poly-crystalline silicon filler layer 33 are removed from the surface of wafer 10, excluding the inside of the trenches 20, by any conventional etching method. The etching of the excessive layers exposes the dielectrics film 21 covering semiconductor regions 14.

The step of etching back is conducted in a mixed gas environment containing $SF_6$ and $O_2$ at a pressure of from 0.1 to 0.2 Torr. The etching back process automatically stops, upon approaching the dielectrics film 21 within 10 to 15 min after the under layer 31 and the filler layer 33 have been removed by about 3 to 6 µm. This is premised upon the fact that poly-crystalline silicon under layer is about 0.5 while the filler layer is about 3–5 µm in thickness, according to this embodiment.

Since the poly-crystalline silicon grain of the poly-crystalline silicon under layer 31 is small, the exposed surface of the dielectrics film 21 is substantially smooth compared to conventional wafers.

Figure 1G:
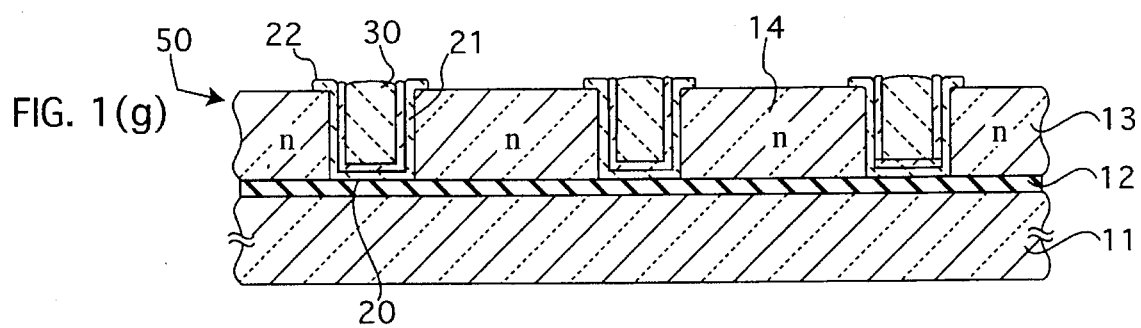
FIG. 1(g) is a sectional view showing the completed dielectrics separation type wafer according to the first method of the present invention.

Referring now to FIG. 1(g), a completed wafer 10 is shown as a dielectrics separation type wafer 50. To bring the wafer 10 to this completed state, the very thin dielectric film 21 is removed from the surface of the semiconductor regions 14 with dilute hydrofluoric acid, leaving the extension 22, around the periphery of trenches 20, unremoved.

Figure 4:
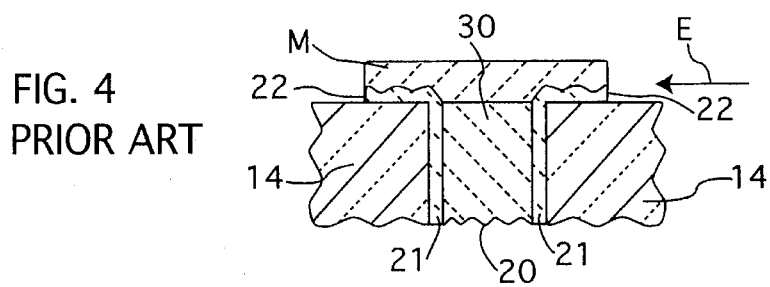
FIG. 4 is a sectional view expanding the upper part of the trench for explaining the problem of the prior art.

Note that contrary to FIG. 4, the echant E seldom penetrates the area between masking M and the extension 22 of the dielectrics film 21. Indeed, it has been confirmed experimentally, that there is minimal defect in the insulation between semiconductor regions 14 in the dielectrics separation type wafer 50, when it is manufactured in accordance with the first method of the present invention.

Figure 2A:
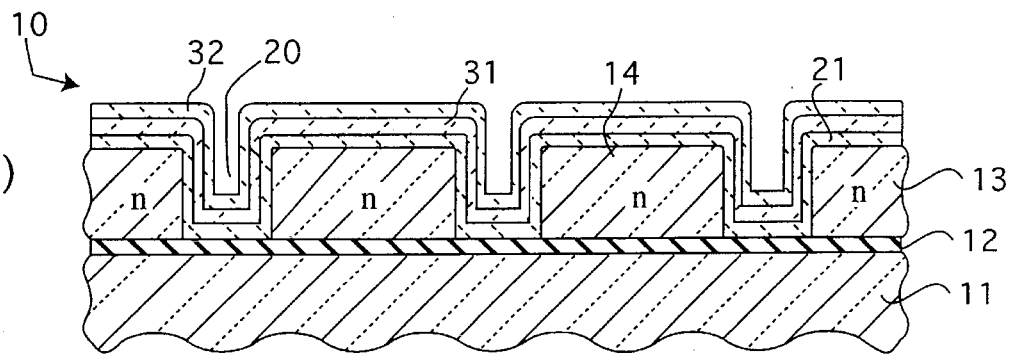
FIG. 2(a) is a sectional view showing the step of depositing the second dielectrics film according to a second method contemplated by the present invention.

Referring now to FIG. 2(a), a poly-crystalline silicon filler layer 33 is grown on a surface of wafer shown generally at 10 is covered by the poly-crystalline silicon under layer 31 as in the previous embodiment. However, the poly-crystalline silicon under layer 31 is shown covered with a thin dielectrics film (the second dielectrics film) 32.

The thin dielectric film 32 is applied to the poly-crystalline silicon under layer 31 layered to a thickness of from 0.1 to 0.2 µm. This is achieved by thermal oxidation of the poly-crystalline silicon under layer 31. Alternatively, the same can be achieved by depositing a silicon oxide film by the CVD under reduced pressure.

Figure 2B:
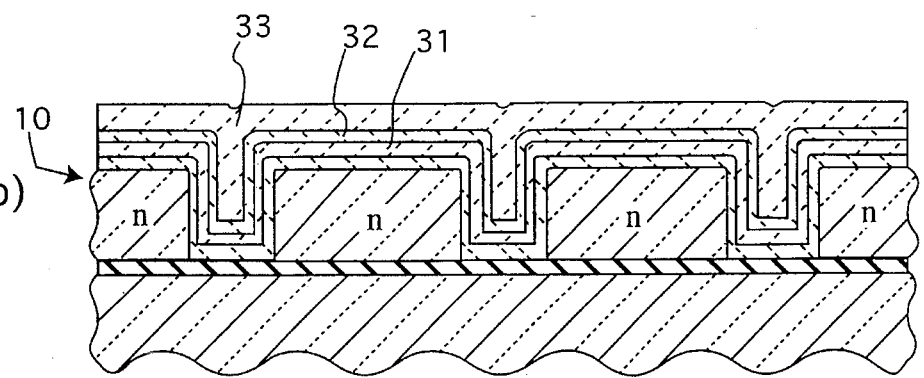
FIG. 2(b) is a sectional view showing the step of growing the poly-crystalline silicon filler layer according to the second method embraced by the present invention.

Referring now to FIG. 2(b), a poly-crystalline silicon filler layer 33 is grown on a surface of wafer 10 such that it fills trenches 20 with poly-crystalline silicon filler layer in a manner similar to the one described previously in FIG. 1(e).

Figure 2C:
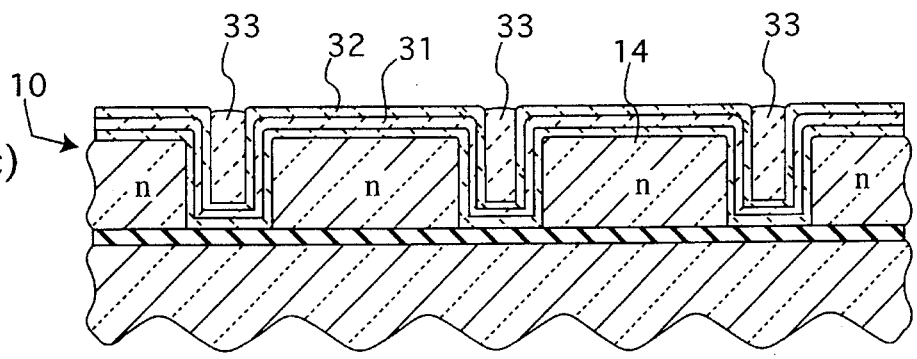
FIG. 2(c) is a sectional view showing the step of removing the excessive poly-crystalline silicon filler layer according to the second method of the present invention.

Referring to FIG. 2(c), the poly-crystalline silicon filler layer 33 is removed from the surface of the wafer 10 leaving behind trenches 20 in the same way as described earlier with reference to FIG. 1(f). This etching back automatically stops at the surface of the second dielectrics film 32 above the semiconductor regions 14 to cease at the state shown in FIG. 2(c).

Figure 2D:
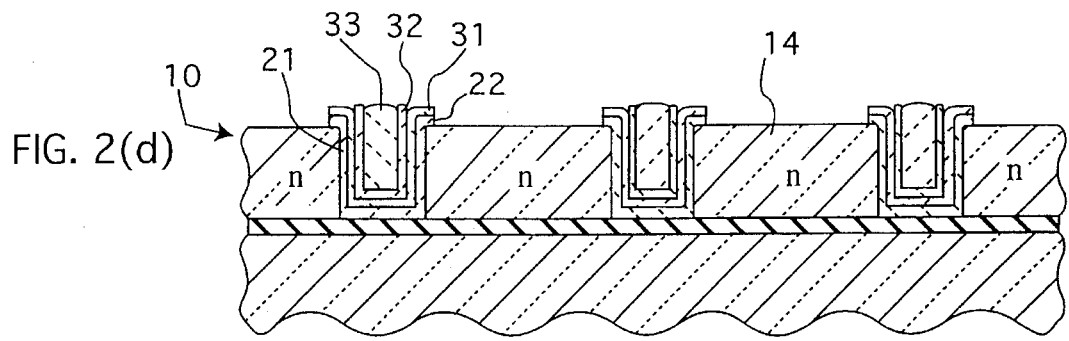
FIG. 2(d) is a sectional view showing the step of patterning the poly-crystalline silicon under layer and the first dielectrics film according to the second method of the present invention.

Referring to FIG. 2(d), the state of the wafer 10, after patterning the poly-crystalline silicon under layer 31 and extensions 22 of the dielectrics film 21 is shown. It is preferable to remove the thin dielectrics film 32 from the entire surface of the wafer 10 excluding the region inside trenches 20 by the action of dilute hydrofluoric acid prior to patterning the poly-crystalline silicon under layer 31 and extensions 22 of the dielectrics film 21.

Using a photoresist film as a patterning mask, the poly-crystalline silicon under layer 31 is removed in a gas mixture containing $SF_6$ and $O_2$ or $CF_4$ and $O_2$ in a period of time sufficient to remove the under layer 31. Such time is usually between 30 seconds and 2 minutes, preferably about 1 min. In like manner and using the same mask, the dielectrics film 21 can also be removed by the action of dilute hydrofluoric acid.

FIG. 2(d) exemplifies the wafer 10 in the state in which the extensions 22 around periphery of the dielectrics film 21 and the poly-crystalline silicon under layer 31 remain only in the peripheral area on the surface of the semiconductor region 14.

Figure 2E:
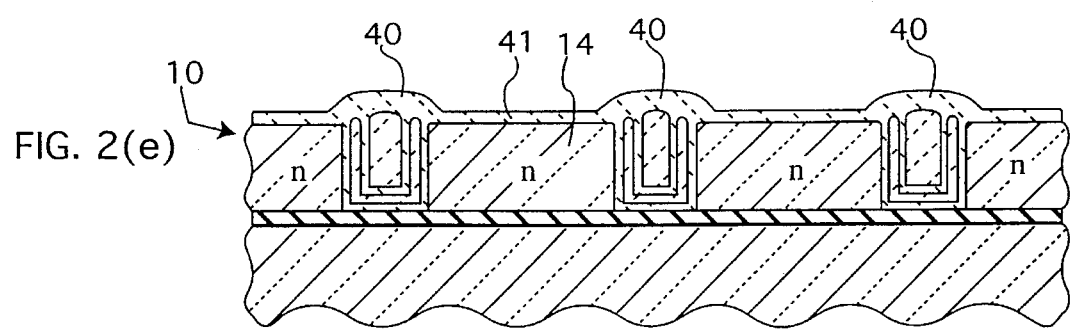
FIG. 2(e) is a sectional view showing the step of thermally oxidizing the poly-crystalline silicon under layer and the poly-crystalline silicon filler layers according to the second method of the present invention.

Referring to FIG. 2(e), a separation film 40 is formed above trench 20 by thermally oxidizing the poly-crystalline silicon under layer 31 and the polycrystalline silicon filler layer 33, even though, it is sufficient to remove only the poly-crystalline silicon under layer 31 from above the extension 22.

Separation film 40 is obtained by the pyrogenic method which utilizes an oxidizing environment at temperatures ranging from 850° to 1000° C., and more preferably from 900° to 950° C., for a period of time ranging from 5 to 10 hours to yield a film ranging in thickness of at least 1 μm or more.

At about this time, the surfaces of the semiconductor regions 14 is also covered by the oxidizing film 41. In order to facilitate the growth of the separation film 40 such that it grows at a rate faster than oxidizing layer 41, it is preferable to heavily dope by diffusion an (n) type exemplified by As or a (p) type impurity into the surface of the poly-crystalline silicon under layer 31 and the poly-crystalline silicon filler layer 33 just prior to the step of thermally oxidizing the poly-crystalline silicon under layer 31 and the poly-crystalline silicon filler layer 33.

Figure 2F:
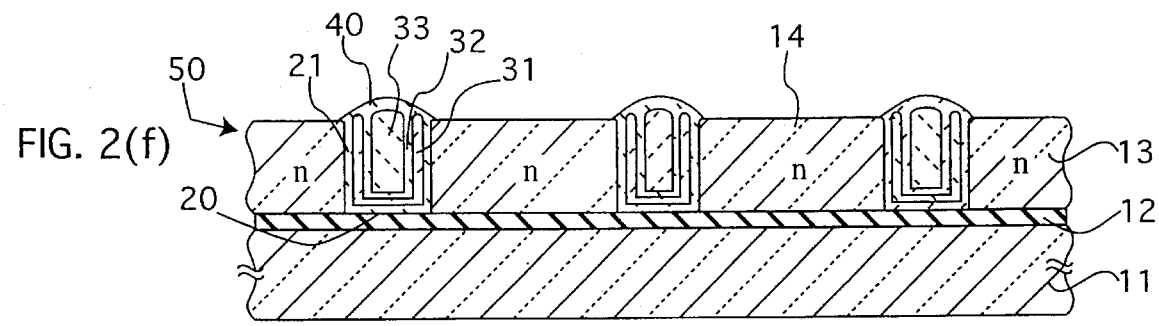
FIG. 2(f) is a sectional view showing the completed dielectrics separation type wafer according to the second method of the present invention.
Figure 3A:
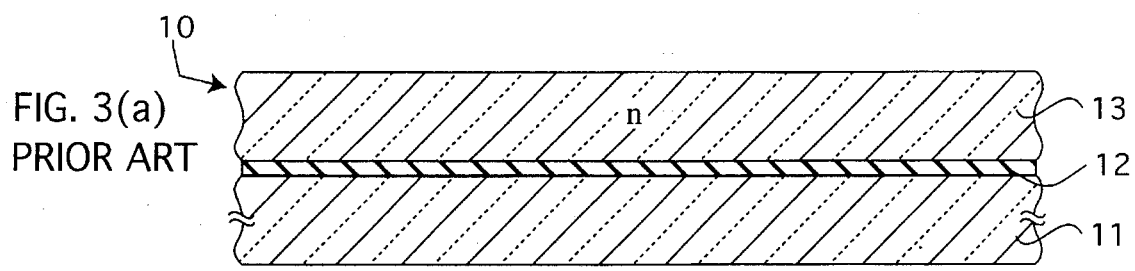
FIG. 3(a) is a sectional view showing a conventional joined substrate type wafer before being separated with dielectrics according to the prior art.
Figure 3B:
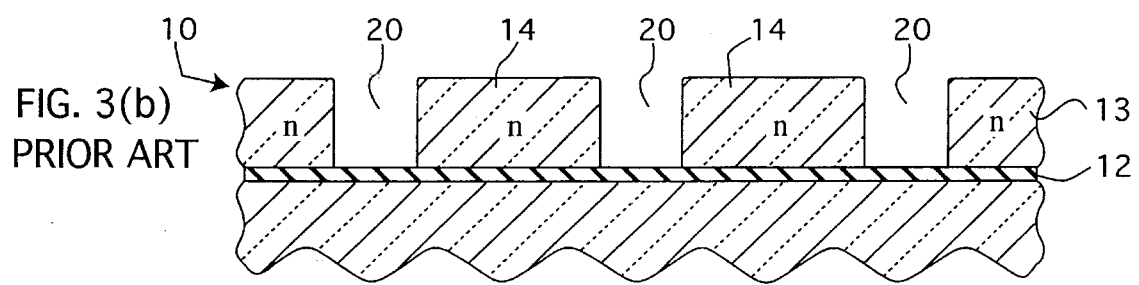
FIG. 3(b) is a sectional view showing the step of digging the trenches in accordance with the prior art.
Figure 3C:
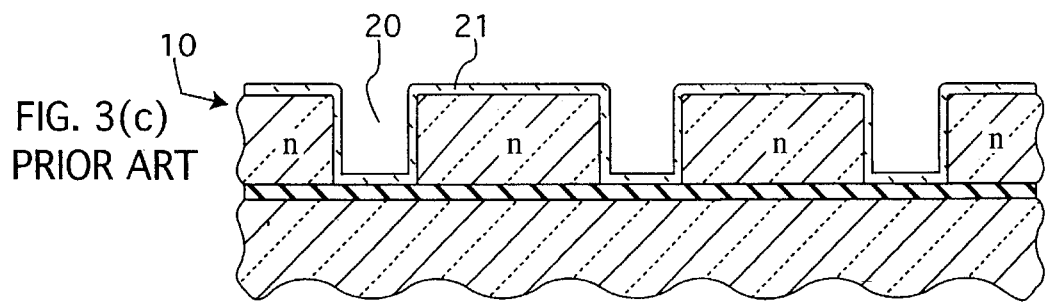
FIG. 3(c) is a sectional view showing the step of depositing the dielectrics film according to the prior art.
Figure 3D:
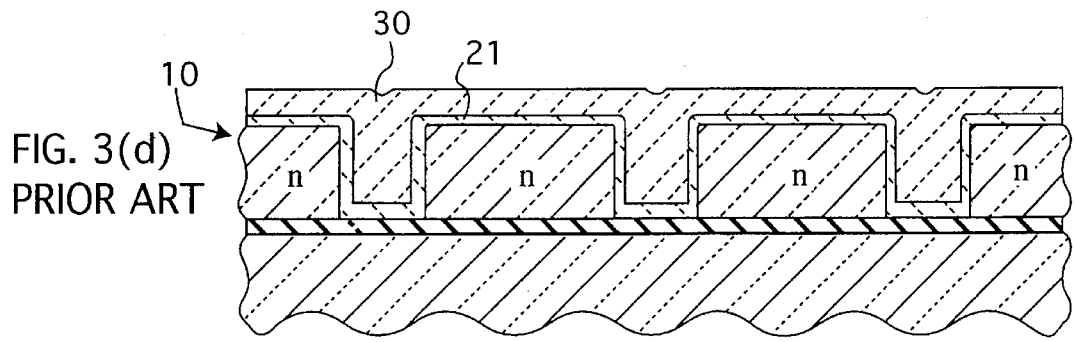
FIG. 3(d) is a sectional view showing the step of filling the trenches according to the prior art.
Figure 3E:
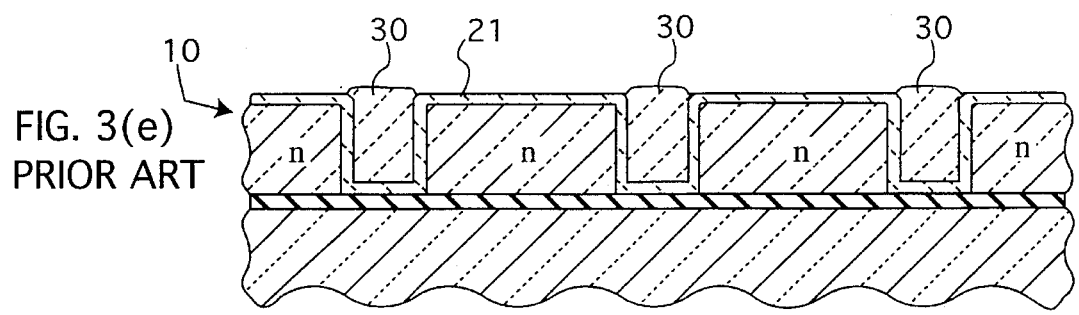
FIG. 3(e) is a sectional view showing the step of removal of excessive poly-crystalline silicon filler layer according to the prior art.
Figure 3F:
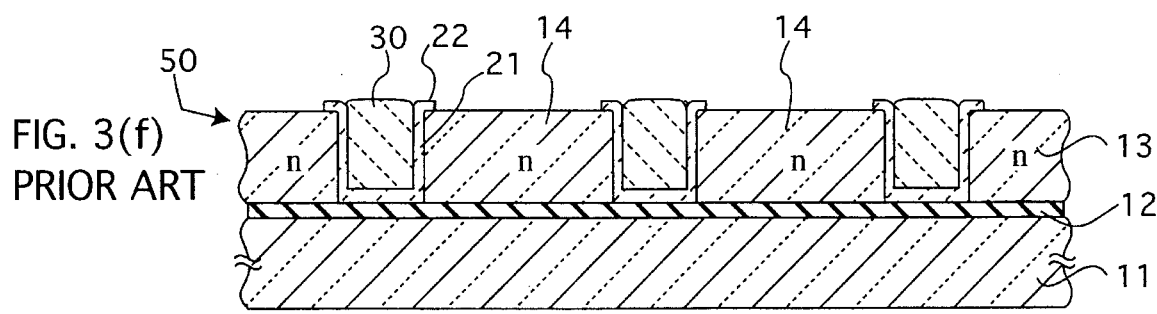
FIG. 3(f) is a sectional view showing the completed conventional dielectrics separation type wafer.

Referring to FIG. 2(f), a dielectrics separation type wafer 50 obtained by the second method is shown. FIG. 2(f) exemplified wafer 10 is shown in a stale in which the wafer 10 embraced by FIG. 2(e) is transformed into the dielectrics separation type wafer 50 of FIG. 2(f). This transformation is facilitated by the removal of the oxidizing film 41 from the surface of the wafer 10 with dilute hydrofluoric acid which, in turn, exposes the semiconductor regions 14.

It is noted that upon removing oxidizing film 41 by the dilute hydrofluoric acid, the surface of separation film 40 can also be etched. However, the etching of the separation film 40 when it contacts the dilute hydrofluoric acid, does not materially affect the separation film 40 because of its thickness of at least 1 μm.

The wafer 50 shown in figure FIG. 2(f), which is separated with dielectrics by the second method of the present invention, substantially improves the ability of the wafer to withstand increased voltage between the semiconductor regions 14 compared to the wafer produced by the first method of the present invention.

Indeed, the wafer 50 formed in accordance with the second method of the present invention, is especially suited for the integrated circuit apparatuses with circuit voltage of several hundreds volts.

In the step exemplified by FIG. 2(e), the poly-crystalline silicon under layer 31 and the poly-crystalline 1 silicon filler layer 33 may be selectively oxidized. The process includes covering the surface of the semiconductor regions 14 with a mask of silicon nitride and similar substances in a manner similar to the LOCOS scheme instead of thermally oxidizing the entire surface of the wafer 10. When the separating film 40 is employed, the poly-crystalline silicon matrix of the poly-crystalline silicon under layer 31 need not be small grained.

To reiterate, the problems of the prior art are caused by the rough surface of the dielectrics film coveting the trench faces (openings). The rough surface, in turn, is caused by the grain size distribution in the poly-crystalline silicon matrix which is grown in contact with the surface of the dielectrics film.

In sum, the present invention is characterized by the above described specific features, and additionally solves the problems of conventional methods by:

1) growing the thin poly-crystalline silicon under layer in contact with the dielectrics film;

2) growing the poly-crystalline silicon filler layer on top of the poly-crystalline silicon under layer so as to fill the trenches; and 3) removing the unnecessary parts (residue) of the poly-crystalline silicon under layer and the poly-crystalline silicon filler layer.

An alternative method overcomes the disadvantages of the prior art by:

1) covering the poly-crystalline silicon under with a second thin dielectrics film;

2) growing a poly-crystalline silicon filler layer on the second thin dielectrics film so as to fill the trenches; and 3) oxidizing the poly-crystalline silicon under and the poly-crystalline silicon filler layer left above the trench, to provide a separation layer, which is an excellent insulator. The under and filler layers referred to above, are the layers remaining after the selective removal, which results in some of the under layer and the filler layer being left behind in and around the trenches.

Thus, the present invention facilitates the formation of a smooth surface on the dielectrics film extension by reducing the crystal size in the poly-crystalline silicon matrix. The methods embraced by one embodiment of the present invention also aids in the removal of the dielectrics film from the surface areas of the semiconductor regions except the trenches. This is done according to the method of the invention by extending protection over the semiconductor region from erosion by the echant during pattern formation.

In sum, the present invention greatly increases the insulation between the semiconductor regions in which a circuit element or a circuit pan of the integrated circuit is built in.

The present invention is applicable to the wafer of the SOI type or joined substrate type, in which trenches are dug from the surface of one substrate to the intermediate dielectrics film, with the same effects as described above.

The method of growing the thin poly-crystalline silicon film to a thickness of 0.5 μm or less, substantially reduces the poly-crystalline silicon grain size and its distribution while shortening the period of time necessary for growing the under layer growth.

The thin dielectrics film of the second embodiment automatically stops the etching back of the filler layer at the surface of the thin dielectrics film, improves the accuracy of the filler layer removal, and reduces the damage of the extension of the dielectrics film during the etching back.

The method of covering the poly-crystalline silicon under layer with thin silicon oxide dielectrics film of from 0.1 to 0.2 μm in thickness, substantially shortens the period of time for the dielectrics film growth while retaining the above described effect.

Likewise, the step of growing the thin silicon oxide dielectrics film by thermal oxidation of the poly-crystalline under layer also reduces the processing steps, which substantially reduce the overall cost of manufacturing wafer according to the present invention.

By removing the thin dielectrics film and the poly-crystalline under layer while simultaneously leaving behind the layers in and around the perimeter of the trenches, together with forming the oxidizing separation films above, the trenches by the thermal oxidation of the poly-crystalline under and filler layers left remaining in and around the trenches, enables the resulting devices, which include wafers produced by the methods contemplated by the invention, to withstand increased voltage between the semiconductor regions.

Indeed, by selectively doping the impurities on the surface of the poly-crystalline under and filler layers prior to the step of thermal oxidation, substantially enhances the thermal oxidation in the regions in which the separation films are to be formed while simultaneously increasing the overall thickness of the separation film.

Having described preferred embodiments of the present invention with reference to the accompanying drawings, it is to be understood that the present invention is not limited to the precise embodiments and that various changes and modifications may be affected therein by one skilled in the art without departing from the scope or spirit of the present invention which is limited only by the appended claims.

What is claimed is:

1. A method for separating a wafer for integrated circuit apparatuses with dielectrics into a plurality of semiconductor regions insulated from each other, wherein said wafer includes a semiconductor substrate on an insulation film, the method comprising the steps of:

digging at least one trench in said semiconductor substrate, wherein a depth of said trench is effective to expose said insulation film, wherein said trench is effective to form a first semiconductor substrate separated from a second semiconductor substrate;

covering a surface of said wafer, said surface including said at least one trench and said first semiconductor substrate and said second semiconductor substrate, with a dielectrics film;

depositing a poly-crystalline silicon under layer on an entire surface of said wafer, wherein said under layer is in a contacting relationship with said dielectrics film;

depositing a poly-crystalline silicon filler layer and filling said at least one trench with said poly-crystalline silicon filler layer, wherein said poly-crystalline silicon under layer has a smaller average grain size and a smaller range of grain size than said poly-crystalline silicon filler layer; and removing each of said under layer and said filler layer from a part of said surface of said wafer wherein said part of said surface including said first semiconductor substrate and said second semiconductor substrate and said part of said surface excludes said at least one trench.

2. The method as claimed in claim 1, wherein said wafer includes an SOI type wafer, which further comprises at least one pair of a semiconductor substrate joined through a dielectrics film, wherein one of said at least one pair of said semiconductor substrate is provided with said trenches dug from a surface thereof down to the dielectrics film.

3. The method as claimed in claim 1, wherein said under layer is deposited to a thickness of about 0.5 µm.

4. A method for separating a wafer for integrated circuit apparatuses with dielectrics into a plurality of semiconductor regions insulated from each other, wherein said wafer includes a semiconductor substrate on an insulation film, the method comprising the steps of:

digging at least one trench in said semiconductor substrate, wherein the depth of said at least one trench is effective to expose said insulation film, wherein said at least one trench is effective to form a first semiconductor substrate separated from a second semiconductor substrate;

covering a surface of said wafer including said at least one trench and said first semiconductor substrate and second semiconductor substrate with a dielectrics film;

depositing a polycrystalline silicon under layer on an entire surface of said wafer, wherein said under layer is in a contacting relationship with said dielectrics film;

covering said under layer with a second dielectrics film;

depositing a poly-crystalline silicon filler layer on said entire surface and filling said at least one trench with said poly-crystalline silicon filler layer, wherein said poly-crystalline silicon under layer has a smaller average grain size and a smaller range of grain size than said poly-crystalline silicon filler layer; and removing said filler layer from a part of said surface of said wafer wherein said part of said surface includes said first semiconductor substrate and said second semiconductor substrate, and said part of said surface excludes said at least one trench.

5. The method as claimed in claim 4, wherein said wafer further comprises an SOI type wafer further comprising a pair of semiconductor substrates joined through a dielectrics film, wherein one of said pair of semiconductor substrates being provided with trenches dug from said surface thereof down to the dielectrics film.

6. The method as claimed in claim 4, wherein the under layer is deposited to a thickness of about 0.5 µm.

7. The method as claimed in claim 4, wherein said second dielectrics film comprises a silicon oxide film deposited to a thickness of about 0.1 µm to about 0.2 µm.

8. The method as claimed in claim 4, further including:

removing said second dielectrics film and said under layer from said part of said surface to yield a remaining under layer and a remaining filler layer; and oxidizing said remaining under layer and said remaining filler layer to yield at least one oxidizing separation (n) film above said at least one trench.

9. The method as claimed in claim 8, further comprising:

doping impurities in the surface of each of said remaining under layer and said remaining filler layer above said at least one trench prior to said step of oxidizing.

10. The method of claim 4 wherein said part of said surface excludes a peripheral area, of said first and said second semiconductor substrate, to said at least one trench.

* * * * *